(12) United States Patent
Chang

(10) Patent No.: US 9,224,351 B1
(45) Date of Patent: *Dec. 29, 2015

(54) DIGITALLY CONTROLLED VOLTAGE GENERATOR

(71) Applicant: IML International, Grand Cayman (KY)

(72) Inventor: Jonathan Chang, San Francisco, CA (US)

(73) Assignee: IML International (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/685,412

(22) Filed: Apr. 13, 2015

Related U.S. Application Data

(60) Continuation of application No. 14/288,311, filed on May 27, 2014, now Pat. No. 9,007,288, which is a division of application No. 12/689,194, filed on Jan. 18, 2010, now Pat. No. 8,736,592.

(51) Int. Cl.
  G09G 3/36 (2006.01)
  H03M 1/68 (2006.01)
  H03M 1/76 (2006.01)

(52) U.S. Cl.
  CPC ............ *G09G 3/3655* (2013.01); *G09G 3/3696* (2013.01); *H03M 1/682* (2013.01); *H03M 1/765* (2013.01); *G09G 2300/0876* (2013.01)

(58) Field of Classification Search
  CPC  G09G 2330/021; G09G 3/367; G09G 3/3696
  See application file for complete search history.

(56) References Cited

U.S. PATENT DOCUMENTS

| 5,714,953 | A | 2/1998 | Mitani et al. |
| 5,969,657 | A | 10/1999 | Dempsey et al. |
| 6,680,733 | B2 | 1/2004 | Woo et al. |
| 6,940,268 | B2 | 9/2005 | Hemminger et al. |
| 7,460,047 | B2 | 12/2008 | Zhang et al. |
| 7,911,437 | B1 | 3/2011 | Bell |
| 9,007,288 | B2 * | 4/2015 | Chang ............................. 345/91 |
| 2002/0063666 | A1 | 5/2002 | Kang et al. |
| 2003/0122757 | A1 | 7/2003 | Bu |
| 2003/0142084 | A1 | 7/2003 | Chang et al. |
| 2004/0105206 | A1 | 6/2004 | Schleifer |
| 2007/0139328 | A1 | 6/2007 | Lan |

* cited by examiner

*Primary Examiner* — Ricardo L Osorio
(74) *Attorney, Agent, or Firm* — Aka Chan LLP

(57) ABSTRACT

A digitally controlled voltage generator is disclosed for use in applications requiring fine resolution voltage control, such as generating a common voltage for a liquid crystal display. A constant resistance digital to analog converter (DAC) is configured to provide appropriate voltage steps by tuning bias resistors to generate desirable reference voltages for the DAC. The bias resistors are configured to be tuned after placement and routing steps in an integrated circuit design.

31 Claims, 6 Drawing Sheets

US 9,224,351 B1

DIGITALLY CONTROLLED VOLTAGE GENERATOR

BACKGROUND OF THE INVENTION

1. Field of the Invention

Embodiments of the present invention relate generally to voltage generator circuits and, more specifically, to a common voltage generator circuit for liquid crystal displays.

2. Description of the Related Art

A modern liquid crystal display (LCD) screen is formed as an array of pixels that are backlit using a uniform polarized light source (backlight). Each pixel comprises at least one region of liquid crystal material sandwiched between two electrodes. A color LCD screen may use three regions of liquid crystal material to form one color pixel comprising red, green, and blue color components. The electrodes are fabricated from an electrically conductive material that is thin enough to be relatively transparent to light, allowing light to pass through both electrodes and each region of sandwiched liquid crystal material. One of the two electrodes is connected to a common voltage (VCOM), and the second electrode is connected to a column wire via a field effect transistor that is configured to connect the column wire to the second electrode in response to a row select signal on a corresponding row wire. The column wire is driven with a voltage value corresponding to a desired intensity for the associated liquid crystal region. A color LCD panel may need three column wires, corresponding to red, green, and blue color components, to determine a color value for one pixel. When a given row is selected, a voltage potential is established between the two electrodes, causing liquid crystal material in a corresponding region to modulate the polarization of light transmitted through the region. The transmitted light originates as polarized light from the backlight, passes through the liquid crystal material, and passes through a polarizing filter before exiting a viewing surface of an LCD panel. By modulating the polarization of the light transmitted through the liquid crystal region, the pixel brightness is correspondingly modulated when viewed from the viewing surface of the LCD panel.

Persons skilled in the art understand that the optimal VCOM voltage for a given LCD panel may vary on a panel-to-panel basis, based on manufacturing variation for the LCD panel. In other words, VCOM for each panel should be individually adjusted, preferably as part of a manufacturing process. One challenge in adjusting VCOM to an optimal value is that relatively small differences in VCOM can cause visible degradation in image quality of a particular LCD panel. For example, a difference of one millivolt can oftentimes have a perceptible effect on image quality. One common type of visible degradation appears as flicker in images displayed by the LCD panel. An analog variable resistor is sometimes used to adjust VCOM with millivolt resolution. However, the analog variable resistor introduces additional manufacturing costs and is therefore not a preferred solution in high-volume LCD manufacturing. A more efficient solution involves digitally adjusting VCOM, as described below in FIG. 1.

FIG. 1 illustrates a prior art digitally controlled common voltage generator circuit 100. The common voltage (VCOM) generator circuit 100 includes a voltage generator 130, and an output driver 132, which generates VCOM 190. VCOM 190 corresponds to a common voltage (VCOM) reference conventionally used in LCD panels. The voltage generator 130 receives an analog voltage on node VDDA 104, and a digital voltage on node VDDB 106. Each voltage is measured with respect to a ground (GND) node 102. The GND node 102 is defined as having a potential of zero volts. A reference voltage associated with VREFA 112, also measured with respect to GND 102, is generated from a resistor divider formed by resistors R 124 and R 122. VREFA 112 is generated according to a target specification for an associated LCD panel. Amplifier 120 is configured to form a voltage follower with a high-impedance input, which is connected to VREFA 112, and a low impedance output, which is connected to VREFB 114. The voltage follower drives VREFB 114 with a low impedance at a voltage corresponding closely to VREFA 112, thereby isolating VREFA 112 from variable sink currents drawn through an "R-2R" digital to analog converter (DAC) 140. Persons skilled in the art will understand that an R-2R DAC 140 presents a variable current load to node VREFB 114, and that the variable current load is a function of a digital DAC value 156. The DAC value 156 conventionally represents a fixed-length integer. Each integer represented by the DAC value 156 has a corresponding voltage value generated at VDAC 150. Each increment in the DAC value 156 has a corresponding voltage step at VDAC 150.

The DAC value 156 comprises a parallel vector transmitted from a serial digital controller 144 to a DAC decoder 142. The serial digital controller 144 receives a serial clock signal SCL 152 and a serial data signal SDA 154. A digital data vector is transmitted from an external device (not shown) via SCL 152 and SDA 154 for representation within the voltage generator 130 as DAC value 156. In one embodiment, the serial data controller 144 adheres to conventional "I2C" signaling.

In response to a given DAC value 156, the DAC decoder 142 generates control signals to activate one or more analog pass gates within the R-2R DAC 140 in order to produce a corresponding output voltage at VDAC 150. VDAC 150 is transmitted to the output driver 132, where amplifier 160, Q 162, and R 164 are configured to convert VDAC 150 to a current, which is sourced from node 188 and sinked through R 164 to GND 102. Resistor R 184 forms the top of a voltage divider, while R 182, Q 162 and R 164 form the bottom of the voltage divider, which is configured to generate a voltage on node 188 that is between VDDA 104 and GND 102. Amplifier 180 is configured as a voltage driver (follower), which drives VCOM 190 with a voltage corresponding closely to the voltage on node 188. Amplifier 180 should be configured to drive enough current to maintain a relatively stable voltage value on node VCOM 190.

One problem with prior art designs for the common voltage generator circuit 100 is that amplifier 120 is costly in terms of die area and power consumption. Additionally, amplifier 120 introduces an offset voltage between VREFA 112 and VREFB 114, that may commonly correspond to dozens of voltage steps at VDAC 150, thereby degrading accuracy and control in the prior art common voltage generator circuit 100. Additional die area or additional power consumption, or both, may be utilized as part of a design trade-off to attempt to reduce the offset voltage associated with amplifier 120. However, such trade-offs further reduce the efficiency of the overall common voltage generator circuit 100.

As the foregoing illustrates, what is needed in the art is a technique for precisely generating a digitally controlled voltage that is more efficient than in existing art.

SUMMARY OF THE INVENTION

One or more embodiments of the invention provide a digitally controlled voltage generator for use in applications requiring fine resolution voltage control, such as generating a common voltage for a liquid crystal display. A constant resistance digital to analog converter (DAC) is configured to provide appropriate voltage steps by tuning bias resistors to generate desirable reference voltages for the DAC. The bias resistors are configured to be tuned after placement and routing steps in an integrated circuit design.

A voltage generator according to an embodiment of the invention includes a constant resistance digital-to-analog converter for generating an output voltage, wherein the constant resistance digital-to-analog converter includes a resistor network and is connected to a reference voltage through a first resistor and to ground through a second resistor. The resistor network may be a linear string of serially connected resistors or a plurality of resistor segments, each having a string of serially connected resistors.

A voltage generator according to another embodiment of the invention includes a constant resistance digital-to-analog converter for generating an output voltage, a resistor divider including a first resistor and a second resistor connected in series between a digital reference voltage and ground, a third resistor connected at a first end to a node between the first resistor and the second resistor and at a second end to the constant resistance digital-to-analog converter, and a fourth resistor connected in series between the constant resistance digital-to-analog converter and ground. According to a further embodiment, the constant resistance digital-to-analog converter includes a plurality of gates that are controlled to generate the output voltage at a desired level.

An LCD display device according to an embodiment of the invention includes a plurality of LCD elements to which is supplied a common voltage reference, and a common voltage reference generator including a constant resistance digital-to-analog converter having a resistor network for generating an output voltage from which the common voltage reference is generated. According to a further embodiment, the common voltage reference generator further includes an output driver for receiving the output voltage from the constant resistance digital-to-analog converter and generating the common voltage reference.

A method of tuning a voltage generator for a digital-to-analog converter that includes a constant resistance digital-to-analog converter, according to an embodiment of the invention includes the steps of adjusting a resistor value of the first resistor, and adjusting a resistor value of the second resistor, wherein the resistor values are adjusted based on parasitic resistance values determined prior to the steps of adjusting.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
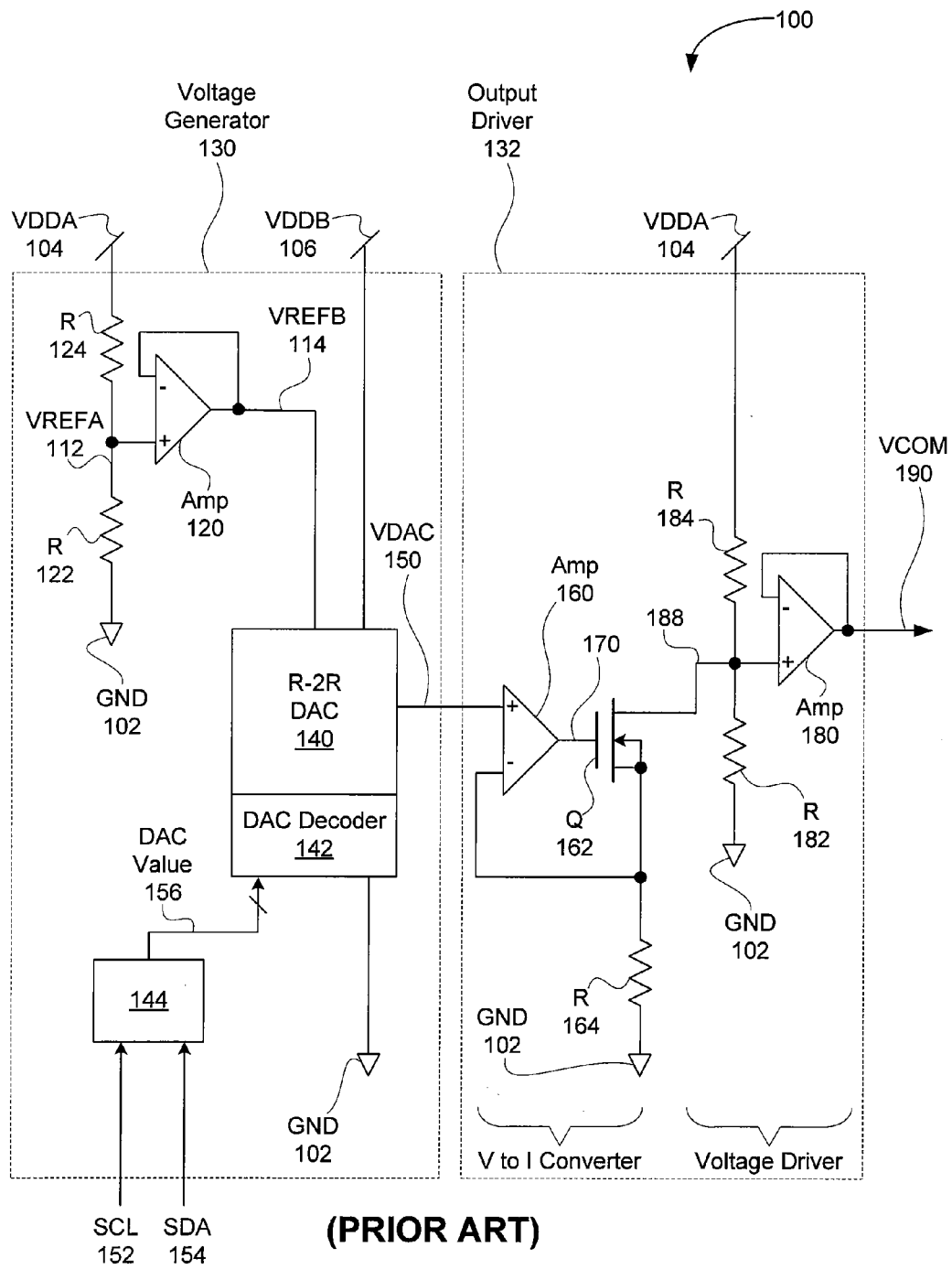
FIG. 1 illustrates a prior art digitally controlled common voltage generator circuit.
Figure 2:
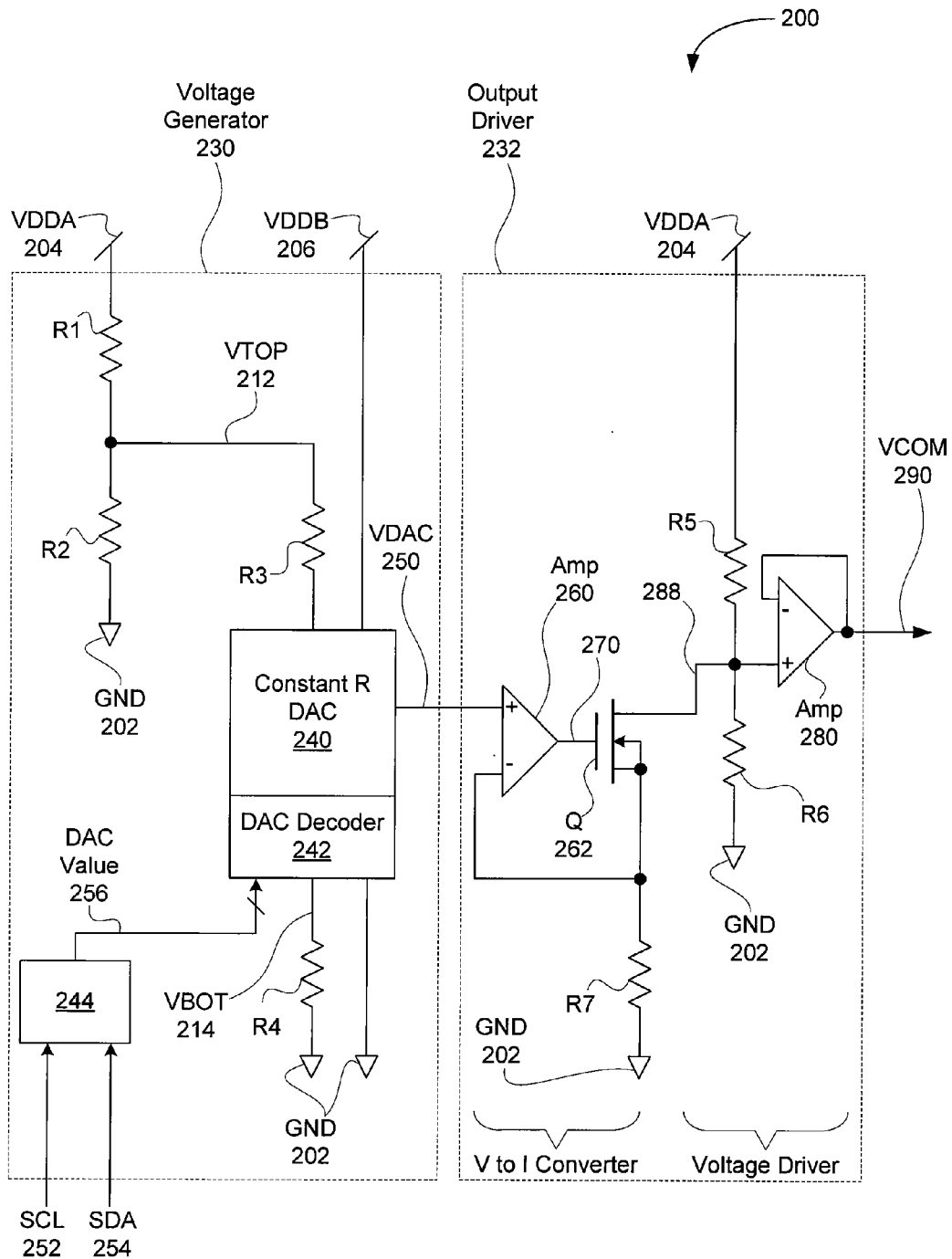
FIG. 2 illustrates an improved digitally controlled common voltage generator circuit, according to one embodiment of the present invention.

FIG. 2 illustrates an improved digitally controlled common voltage generator circuit 200, according to one embodiment of the present invention. The common voltage generator circuit 200 of the present invention includes a voltage generator 230, and an output driver 232, which generates a digitally controlled common voltage on VCOM 290. VCOM 290 corresponds to a common voltage (VCOM) reference conventionally used in LCD panels. The voltage generator 230 receives an analog voltage on node VDDA 204, and a digital voltage on node VDDB 206. Each voltage is measured with respect to a ground (GND) node 202. The GND node 202 is defined as having a potential of zero volts. A reference voltage on node VTOP 212, measured with respect to GND 202, is a function of voltage VDDA 204, R1, R2, R3, a constant resistance (RDAC) associated with constant R DAC 240, and R4.

The DAC value 256 conventionally represents a fixed-length integer. Each integer represented by the DAC value 256 has a corresponding voltage value generated at VDAC 250. Each increment in the DAC value 256 has a corresponding voltage step at VDAC 250. The DAC value 256 comprises a parallel vector transmitted from a serial digital controller 244 to a DAC decoder 242. The serial digital controller 244 receives a serial clock signal SCL 252 and a serial data signal SDA 254. A digital data vector is transmitted from an external device (not shown) via SCL 252 and SDA 254 for representation within the voltage generator 230 as DAC value 256. In one embodiment, the serial data controller 244 adheres to conventional "I2C" signaling.

In response to a given DAC value 256, the DAC decoder 242 generates control signals to activate one or more analog pass gates within the constant R DAC 240 in order to produce a corresponding output voltage at VDAC 250. VDAC 250 is transmitted to the output driver 232, where amplifier 260, Q 262, and R7 are configured to convert VDAC 250 to a current, which is sourced from node 288 and sinked through R7 to GND 102. Resistor R5 forms the top of a voltage divider, while R7, Q 262 and R6 form the bottom of the voltage divider, which is configured to generate a voltage on node 288 that is between VDDA 204 and GND 202. Amplifier 280 is configured as a voltage driver (follower), which drives VCOM 290 with a voltage corresponding closely to the voltage on node 288. Amplifier 280 should be configured to drive enough current to maintain a relatively stable voltage value on node VCOM 290.

A design methodology for selecting values of R1, R2, R3, R4 is described below. RDAC is taken as a given here, although persons skilled in the art will recognize that design trade-off also exist when designing constant R DAC 240, and those trade-offs lead to a final value of RDAC. In general, RDAC should be a relatively large resistance value (KΩ's through MΩ's) for low power operation.

Equation 1 is used to compute values for R3 and R4. RBIAS is computed and assigned to R3 (as a nominal value for R3) for the upper voltage range of VDAC 250, and RBIAS is computed again and assigned to R4 (as a nominal value for R4) for the lower voltage range of VDAC 250. RBIAS is computed based on RDAC, N (number of bits in DAC value 256), and α, an offset value measured in integral (LSB) steps of DAC value 256. When R3 is computed, α represents a number of steps below VREF 212 a maximum VDAC 250 voltage should be. When R4 is computed, α represents a number of steps above 0 a minimum VDAC 250 value should be.

$$R_{BIAS} = \frac{\alpha}{2^N - \alpha} R_{DAC} \quad \text{(Equation 1)}$$

Equation 2 is used to compute RDAC for the special case of a constant R DAC 240 comprising a linear resistor string. Persons skilled in the art will recognize that other techniques, including segmented resistor string DAC architectures, may also be used to build the constant R DAC 240. Computing RDAC for DAC structures other than a series resistor string should be computed according to the particular topology of the given DAC structure. For example, a segmented resistor string DAC is characterized by a sum of resistance values associated with a primary rank of resistors.

$$R_{DAC} = \Sigma RS \quad \text{(Equation 2)}$$

An equivalent resistance of the resistive path from VTOP 212 through the constant R DAC 240 to ground is given in Equation 3.

$$R_{EQUIV} = R_3 + R_4 + \Sigma RS \quad \text{(Equation 3)}$$

Equation 4 should be used to compute a resistance value for R1. Equation 4 uses REQUIV computed in Equation 3, analog voltage VDDA 204, a target value for VREF (VTOP 212), and value for R2. In one embodiment R2 is set to REQUIV. The target value for VREF dictates the upper voltage limit for VDAC 250, independent of offsets implemented using bias resistors R3 and R4.

$$R_1 = \frac{(R_2 \parallel R_{EQUIV})(V_{DDA} - V_{REF})}{V_{REF}} \quad \text{(Equation 4)}$$

Using Equations 1 through 4, values for R1, R2, R3, and R4 may be computed and used as nominal design values in a physical design (integrated circuit mask layout) implementation of the common voltage generator circuit 200. The physical design implementation may be generated and advantageously used in multiple different integrated circuit designs, each potentially with different routing constraints. As such, parasitic resistance between GND 202 and true ground for the integrated circuit hosting the common voltage generator circuit 200 may cause VDAC 250 to be offset with respect to a desired design target. Similarly, parasitic resistance between VDDA 204 and the true analog supply voltage for the integrated circuit may cause VDAC 250 to be offset with respect to a desired design target.

In a typical physical design setting, the common voltage generator circuit 200 may be subject to different parasitic resistance values between VDDA 204, GND 202, and their respective reference nodes on different designs. Furthermore, the parasitic resistance values are not conventionally known until after circuitry outside the common voltage generator circuit 200 is placed and routed within the integrated circuit.

To compensate for parasitic resistance values outside of the common voltage generator circuit 200, bias resistors R3 and R4 may be adjusted in a step performed after conventional place and route has been performed and relevant parasitic resistance values may be determined. Each of the bias resistors R3 and R4 is configured to be independently tunable using a small number of layer modifications. For example, R3 and R4 may be configured to be tunable by placing a via cut (one layer modification) in one or more pre-defined locations. Alternatively, R3 and R4 may be independently configured by placing a poly-silicon contact (one layer modification) in a specified location. Alternatively, R3 and R4 may be independently configured by placing a poly-silicon bridge (one layer modification) in a specified location between two strips of poly-silicon. Persons skilled in the art will recognize that various other techniques for tuning R3 and R4 may be implemented without departing the scope of the present invention. Furthermore, persons skilled in the art will recognize that bias resistors R3 and R4 should be designed to accommodate a range of values to compensate for a range of parasitic resistance values coupled to VDDA 204 and GND 202.

Figure 3A:
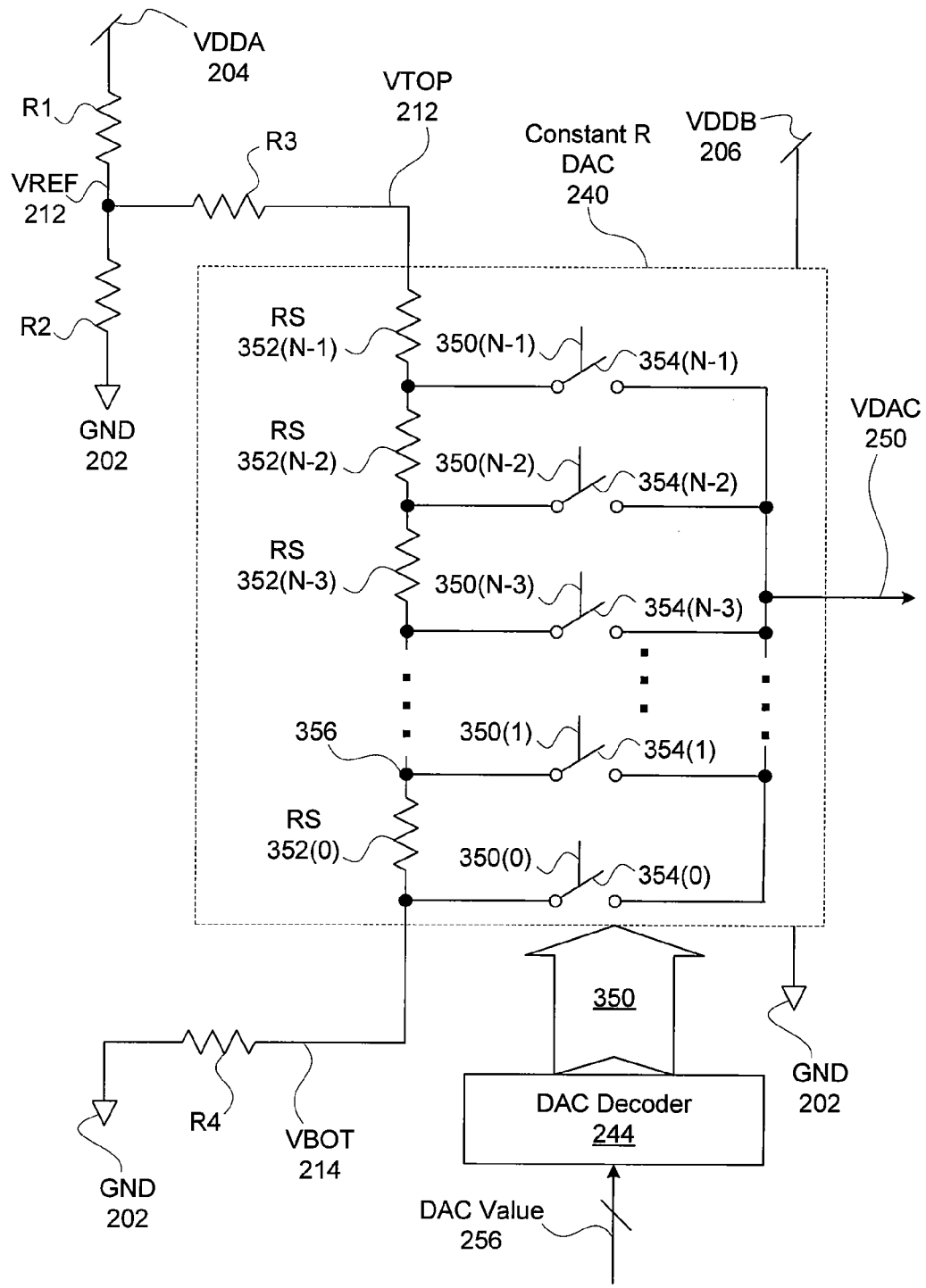
FIG. 3A illustrates an exemplary constant resistance digital to analog converter employing a linear architecture, according to one embodiment of the present invention.

FIG. 3A illustrates an exemplary constant resistance (R) digital to analog converter (DAC) 240 employing a linear architecture, according to one embodiment of the present invention. The constant R DAC 240 comprises a series string of resistors RS 352, each connected to a corresponding pass gate 354. Each pass gate 354 is also coupled to VDAC 250, which serves as the output node of the constant R DAC 240. Each pass gate 354 is controlled by a corresponding control signal 350, which is generated by a DAC decoder 244.

In one embodiment, the DAC decoder 244 activates one control signal 350 at a time to turn on one pass gate 354 at a time. The DAC decoder 244 activates one control signal 350 in response to receiving a corresponding DAC value 256. For example, a DAC value 256 of "1" may be decoded by the DAC decoder 244 to activate control signal 350(1), which closes pass gate 354(1) to couple node 356 to VDAC 250, thereby transmitting the voltage on node 356 to VDAC 250. Each sequential node along the series string of resistors RS 352 establishes a discrete voltage that is linearly distributed between VBOT (the voltage on node VBOT 214) and VTOP (the voltage on node VTOP 212). A substantially identical voltage step is established along sequential nodes. By activating a given pass gate 354, a corresponding discrete voltage is transmitted to VDAC 250. In one embodiment, N is an integral power of two, such as 2^6 (64), 2^7 (128), 2^8 (256), and so forth. When N is an integral power of two, VDAC 250 ranges from VBOT to VTOP*(2^N−1)/(2^N).

The values of R1, R2, R3, and R4 are selected as described previously in FIG. 2. Persons skilled in the art will recognize that any constant R DAC, regardless of architecture, may be employed as constant R DAC 240 without departing the scope of the present invention.

Figure 3B:
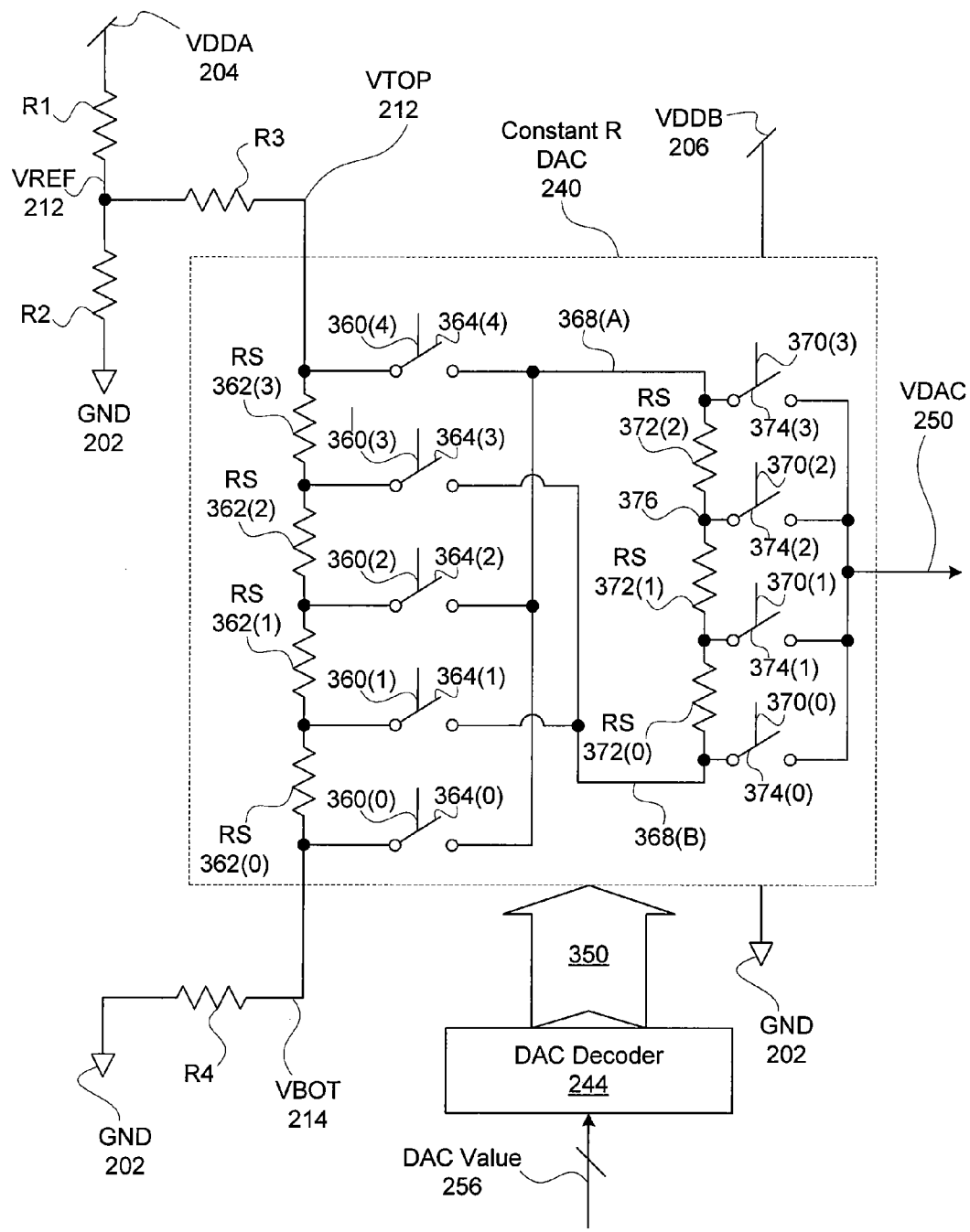
FIG. 3B illustrates an exemplary constant resistance digital to analog converter employing a segmented architecture, according to one embodiment of the present invention.

FIG. 3B illustrates an exemplary constant resistance (R) digital to analog converter (DAC) 240 employing a segmented architecture, according to one embodiment of the present invention. The constant R DAC 240 comprises a plurality of resistor string segments coupled to pass gates that are used to couple one resistor in each one of the resistor string segments to either another resistor string segment or to an output node. For example, resistors RS 362 comprise a first resistor string segment, and resistors RS 372 comprise a second resistor string segment. Pass gates 364 connect resistors 362 the second resistor string segment via intermediate nodes 368. Resistors 372 are connected to intermediate nodes 368 and output node VDAC 250. Each pass gate 364, 374 is controlled by a corresponding control signal 360, 370, generated by a DAC decoder 244 and transmitted to the constant R DAC 240 as control signals 350.

In one embodiment, the DAC decoder 244 activates two control signals 360 at a time to turn on two pass gates 364 at a time, coupling one resistor RS 362 in parallel with intermediate nodes 368. The DAC decoder 244 activates one control signal 370 at a time to couple a selected voltage from a final resistor string segment to output node VDAC 250. In this example, the second resistor string segment is the final resistor string segment. Each resistor string segment corresponds to bits of decreasing significance in the magnitude of DAC value 256. The first resistor strong segment corresponds to the most significant bits of DAC value 256, while the final resistor string segment corresponds to the least significant bits of DAC value 256. Persons skilled in the art will readily understand that an arbitrary number of resistor string segments may be coupled together in this way to form a constant R DAC of arbitrary resolution, where each resistor string segment has one resistor coupled in parallel with a successively lower significance segment, with the exception of the final resistor string segment, which is coupled to the output node VDAC 250.

The control signals 350 are generated in response to receiving a corresponding DAC value 256. For each resistor string segment, a set of control bits, corresponding to bits within the DAC value 256, is generated within control signals 350. For example, control signals 350 comprise most significant bit control signals 360 generated from two most significant bits of DAC value 256. Control signals 350 further comprise least significant bit control signals 370, generated from two least significant bits of DAV value 256. For example, a DAC value 256 of "0001" (one linear voltage increment going from VBOT 214 towards VTOP 212) should be decoded by the DAC decoder 244 to activate control signals 360(0), 360(1), and 370(2), which closes pass gate 364(0), 364(1), and 374(2) to couple node 376 to VDAC 250, thereby transmitting the voltage on node 376 to VDAC 250. The voltage on node 376 appropriately corresponds to one linear voltage increment, going from VBOT 214 towards VTOP 212.

The values of R1, R2, R3, and R4 are selected as described previously in FIG. 2. Persons skilled in the art will recognize that any constant R DAC, regardless of architecture, may be employed as constant R DAC 240 without departing the scope of the present invention.

Figure 4A:
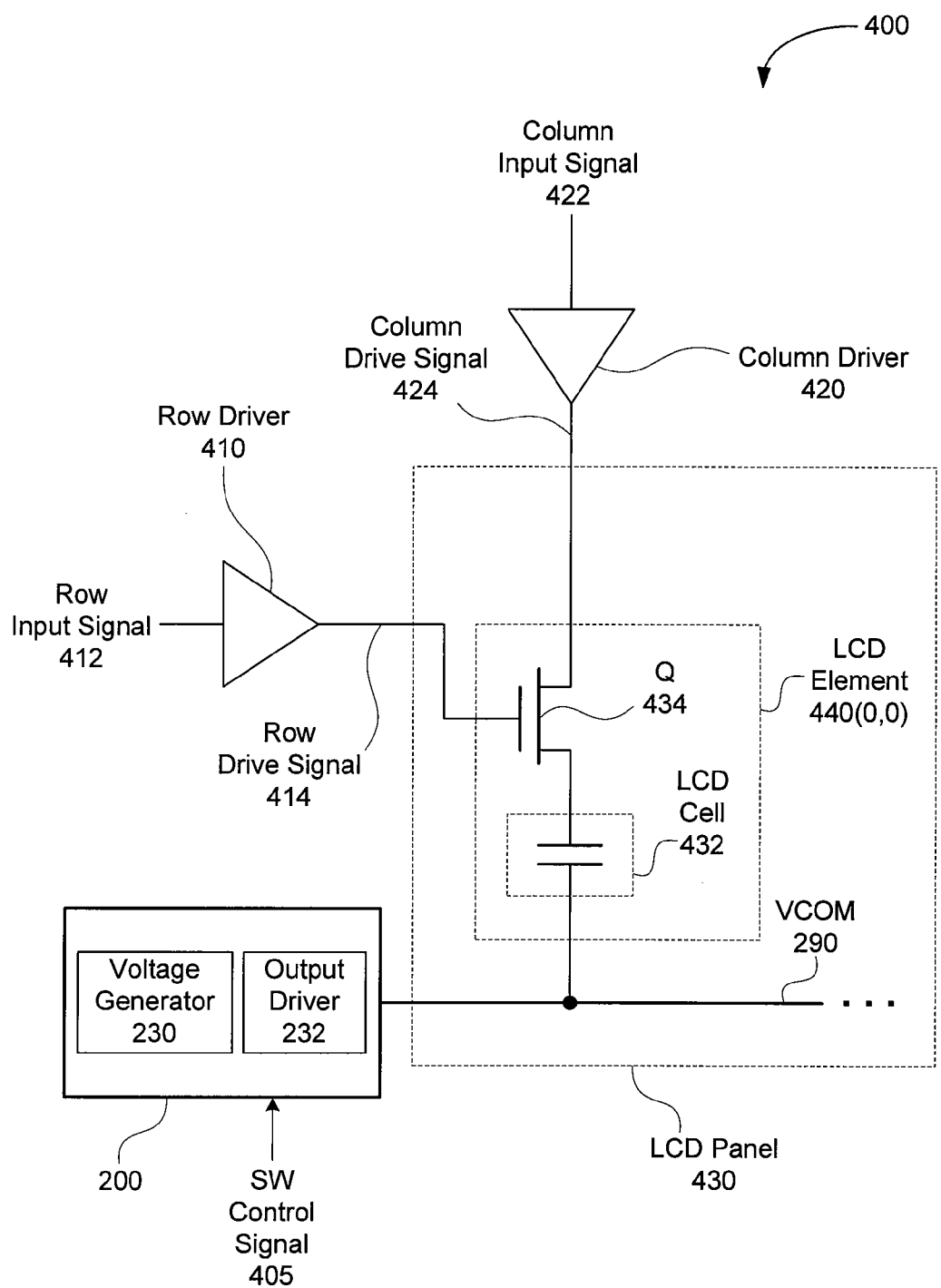
FIG. 4A depicts a liquid crystal display (LCD) subsystem, configured to implement one or more aspects of the present invention.

FIG. 4A depicts a liquid crystal display (LCD) subsystem 400, configured to implement one or more aspects of the present invention. The LCD subsystem 400 includes the common voltage generator circuit 200 of FIG. 2, an LCD panel 430, a column driver 420 and a row driver 410. The LCD panel 430 includes an LCD element 440(0,0), which includes a transistor, Q 434, and an LCD cell 432. The LCD cell 432 includes a liquid crystal region sandwiched between two electrodes. A first electrode of the two electrodes is connected to VCOM 290. A second electrode of the two electrodes is connected to Q 434, which is coupled to column drive signal 424. When Q 434 is turned on, the column drive signal 424 is coupled to the second of the two electrodes. A voltage potential between the two electrodes modulates polarization rotation within the LCD cell 432, which, in turn, controls how much light is transmitted through the LCD cell 432.

The row driver 410 receives a row input signal 412, and generates a row drive signal 414. The row input signal 412 should be a digital signal having two defined states, corresponding to an active state and an inactive state. In the active state, the row driver 410 drives a row drive signal 414 that turns on Q 434, coupling the column drive signal 424 to the LCD cell 432. The column driver 420 receives an analog column input signal 422 and drives the column input signal 422 as a voltage on column drive signal 424. In one embodiment, the column input signal 422 is an analog voltage signal that represents an amount of light to be transmitted by LCD element 440(0,0) when the row drive signal 414 is in the active state. The amount of light is determined by the voltage potential between the column drive signal 424 and VCOM 290. In one embodiment, a software control signal 405 is used to drive signals SCL 252 and SDA 254, of FIG. 2, to configure an output voltage value for VCOM 290.

Figure 4B:
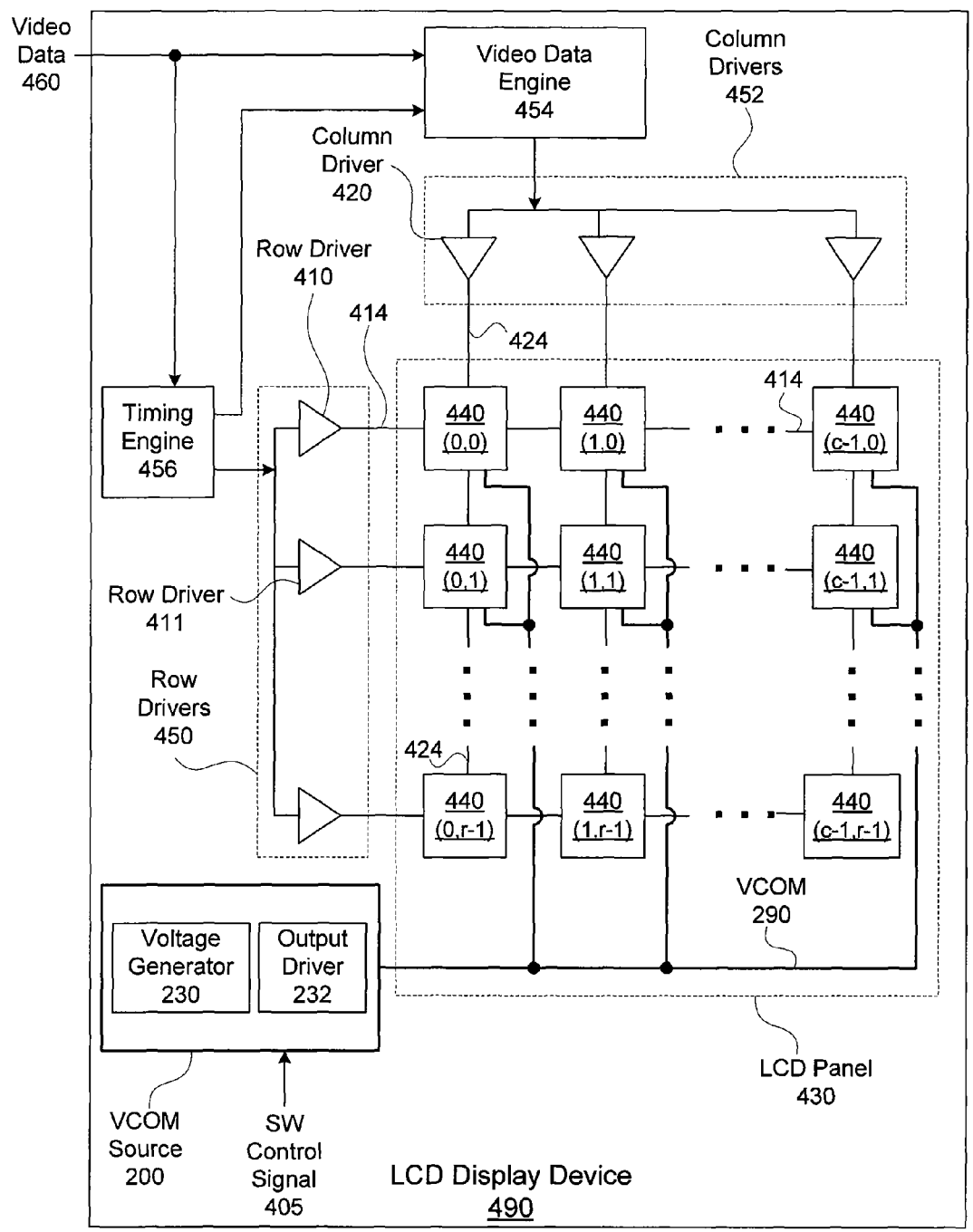
FIG. 4B illustrates an LCD display device, configured to implement one or more aspects of the present invention.

FIG. 4B illustrates an LCD display device 490, configured to implement one or more aspects of the present invention. The LCD display device 490 includes the common voltage generator circuit 200 of FIG. 2, the LCD panel 430, row drivers 450, column drivers 452, a timing engine 456, and a video data engine 454. The video data engine 454 receives video information via input video data 460. The video information includes rows of intensity data that form sequential video frames of two-dimensional intensity data. The video information also includes timing information delineating lines of intensity data within delineated sequential video frames. The intensity data is transmitted to the video data engine 454 and the timing information is transmitted to the timing engine 456. Timing information may also be transmitted to the video data engine 454.

The timing engine 456 extracts line and frame timing information to generate control signals for activating individual drivers within row drivers 450. For example, at the start of a new frame, and after a first row of intensity data is received by the video data engine 454, row driver 410 may be activated. After a second row of intensity data is received by the video data engine 454, row driver 411 may be activated, and so forth. Column drivers 452 receive analog input signals from the video data engine 454 to drive analog voltages on column wires within the LCD panel 430. When one row is activated, the column wires configure a row of LCD elements 440 to transmit an a corresponding set of intensity values. Each one of the LCD elements 440 should be a substantially identical instance of LCD element 440(0,0), described in FIG. 4A.

As an example of the operation of the LCD display device 290, when row driver 410 is active, column driver 420 drives LCD cell 432 within LCD element 440(0,0) via column wire 424 with a voltage corresponding to a desired intensity for the LCD element 440(0,0). The voltage, in conjunction VCOM 290, determines an intensity value the LCD element 440(0,0). In a color LCD panel 430, three LCD elements 440 (red, green, blue) are used to form one color pixel. In one embodiment, a software (SW) control signal 405 is used to drive signals SCL 252 and SDA 254, of FIG. 2, to configure an output voltage value for VCOM 290. The SW control signal 405 may be used during manufacturing to establish a value for VCOM 290. The value for VCOM 290 may be stored in non-volatile memory (not shown) within the LCD display device 290.

In sum, a technique for generating a digitally controlled voltage is disclosed. The digitally controlled voltage is suitable for use as a common voltage in LCD display panels. The technique is based on a circuit architecture comprising four resistors and a constant R DAC, such as a resistor string DAC. The four resistors are used to provide appropriate reference voltages to the constant R DAC. At least two of the four resistors are configured to be tunable in a layout modification step performed after conventional place and route physical design of a related integrated circuit.

One advantage of the disclosed invention is that the circuit architecture is simplified with respect to conventional common voltage generators through the elimination of an operational amplifier. Furthermore, lower power and greater accuracy may also be achieved by eliminating the operational amplifier, which introduces an offset voltage. This offset voltage represents an error in the digitally controlled voltage output. Another advantage of the disclosed invention is that the bias resistors may be configured to compensate for post-layout routing resistance that deviates from nominal routing resistance values. Yet another advantage of the disclosed invention is that dynamic power consumption within the constant R DAC may be reduced on average versus a conventional "R2R" resistor DAC because current flow through the constant R DAC remains essentially constant.

While the forgoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

In view of the foregoing, the scope of the present invention is determined by the claims that follow.

The invention claimed is:

1. An LCD display device comprising:
a plurality of LCD elements to which is supplied a common voltage reference; and
a common voltage reference generator including a digital-to-analog converter having an impedance network for generating an output voltage from which the common voltage reference is generated,
wherein the common voltage reference generator further includes an impedance circuit comprising a first impedance and a second impedance connected in series between an analog reference voltage and ground, a third impedance connected at a first end to a node between the first impedance and the second impedance and at a second end to the digital-to-analog converter, and a fourth impedance connected in series between the digital-to-analog converter and ground.

2. The LCD display device according to claim 1, wherein the common voltage reference generator further includes an output driver for receiving the output voltage from the digital-to-analog converter and generating the common voltage reference.

3. The LCD display device according to claim 1, wherein the digital-to-analog converter further includes a plurality of gates that are controlled to generate the output voltage at a desired level.

4. The LCD display device according to claim 3, wherein the gates are controlled in accordance with a fixed-length integer value.

5. The LCD display device according to claim 1, wherein the impedance network includes a linear string of serially connected impedances.

6. The LCD display device according to claim 1, wherein the impedance network includes a plurality of impedance segments, each having a string of serially connected impedances.

7. The LCD display device according to claim 1, wherein an electrical path between an analog reference voltage and the digital-to-analog converter does not traverse an amplifier.

8. A method of tuning a voltage generator for a digital-to-analog converter that includes a digital-to-analog converter connected to a first reference voltage level through a first impedance and to ground through a second impedance, the method comprising:
computing a first nominal impedance value for the first impedance;
computing a second nominal impedance value for the second impedance;
adjusting an impedance of the first impedance according to the first nominal impedance value; and
adjusting an impedance of the second impedance according to the second nominal impedance value,
wherein a third impedance and a fourth impedance are coupled in series between a second reference voltage level and ground, and the first impedance is coupled to a node between the third impedance and the fourth impedance.

9. The method of claim 8 comprising determining parasitic impedance values prior to the adjusting, wherein the impedance of the first impedance and the impedance of the second impedance are adjusted based on the parasitic impedance values.

10. A voltage generator comprising:
a digital-to-analog converter for generating an output voltage; and
a first impedance and a second impedance coupled between an analog reference voltage and ground,
wherein the digital-to-analog converter is coupled to a node between the first impedance and the second impedance through a third impedance and to ground through a fourth impedance wherein the analog-to-digital converter includes an impedance network and a plurality of gates that are controlled to generate the output voltage at a desired level.

11. The voltage generator according to claim 10 wherein the gates are controlled in accordance with a fixed-length integer value.

12. The voltage generator according to claim 10 wherein the impedance network includes a linear string of serially coupled impedances.

13. The voltage generator according to claim 11 wherein the impedance network includes a plurality of impedance segments, each having a string of serially coupled impedances.

14. A voltage generator comprising:
a digital-to-analog converter for generating an output voltage;
a first impedance and a second impedance connected in series between an analog reference voltage and ground;
a third impedance connected at a first end to a node between the first impedance and the second impedance and at a second end to the digital-to-analog converter; and
a fourth impedance connected in series between the digital-to-analog converter and ground.

15. The voltage generator according to claim 14 wherein the digital-to-analog converter includes a plurality of gates that are controlled to generate the output voltage at a desired level.

16. The voltage generator according to claim 15 wherein the gates are controlled in accordance with a fixed-length integer value.

17. The voltage generator according to claim 15 wherein the impedance network includes a linear string of serially coupled impedances.

18. The voltage generator according to claim 15 wherein the impedance network includes a plurality of impedance segments, each having a string of serially coupled impedances.

19. The voltage generator according to claim 15 wherein the digital-to-analog converter includes an impedance network.

20. A method comprising:
providing a digital-to-analog converter for generating an output voltage;
providing an impedance circuit including a first impedance and a second impedance coupled between an analog reference voltage and ground;
providing a third impedance coupled at a first end to a node between the first impedance and the second impedance and at a second end to the digital-to-analog converter; and
providing a fourth impedance coupled between the digital-to-analog converter and ground.

21. The method of claim 20 wherein the digital-to-analog converter comprises an impedance network and a plurality of gates that are controlled to generate the output voltage at a desired level.

22. The method of claim 21 wherein the digital-to-analog converter comprises an impedance network.

23. The method of claim 21 wherein the gates are controlled in accordance with a fixed-length integer value.

24. The method of claim 21 wherein the impedance network comprises a linear string of serially coupled impedances.

25. The method of claim 21 wherein the impedance network comprises a plurality of impedance segments, each having a string of serially coupled impedances.

26. A method comprising:
providing a digital-to-analog converter for generating an output voltage;
providing an impedance circuit comprising a first impedance and a second impedance coupled in series between a reference voltage and ground, wherein an impedance circuit output is a node between the first impedance and the second impedance;
providing a third impedance coupled between the divider output and the digital-to-analog converter; and
providing a fourth impedance coupled between the digital-to-analog converter and ground.

27. The method of claim 26 wherein the digital-to-analog converter comprises an impedance network and a plurality of gates that are controlled to generate the output voltage at a desired level.

28. The method of claim 27 wherein the digital-to-analog converter comprises an impedance network.

29. The method of claim 27 wherein the gates are controlled in accordance with a fixed-length integer value.

30. The method of claim 27 wherein the impedance network comprises a linear string of serially coupled impedances.

31. The method of claim 27 wherein the impedance network comprises a plurality of impedance segments, each having a string of serially coupled impedances.

* * * * *